United States Patent
Yu

(10) Patent No.: US 6,345,210 B1
(45) Date of Patent: *Feb. 5, 2002

(54) METHOD OF USING CRITICAL DIMENSION MAPPING TO QUALIFY A RETICLE USED IN INTEGRATED CIRCUIT FABRICATION

(75) Inventor: Warren T. Yu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/263,069

(22) Filed: Mar. 8, 1999

(51) Int. Cl.[7] .............................................. G06F 19/00
(52) U.S. Cl. ............................ 700/121; 250/492; 430/5
(58) Field of Search ............................ 700/121; 716/4; 430/22, 30, 5; 365/120; 250/492; 382/144–145; 355/53

(56) References Cited

U.S. PATENT DOCUMENTS

| | | | |
|---|---|---|---|
| 5,392,361 A | | 2/1995 | Imaizumi et al. |
| 5,646,870 A | * | 7/1997 | Krivokapic et al. ........... 716/4 |
| 5,965,306 A | * | 10/1999 | Mansfield et al. ............ 430/22 |
| 5,985,497 A | * | 11/1999 | Phan et al. ................... 430/30 |
| 5,986,765 A | * | 11/1999 | Nakasuji ...................... 356/399 |
| 6,044,007 A | * | 3/2000 | Capodieci .................... 365/120 |
| 6,115,108 A | * | 9/2000 | Capodieci .................... 355/77 |
| 6,215,127 B1 | * | 4/2001 | Yu ............................. 250/492 |

OTHER PUBLICATIONS

S. Wolf and R.N. Tauber, Silicon Processing for the VLSI Era, vol. 1—Process Technology, pages 446–455.

* cited by examiner

Primary Examiner—William Grant
Assistant Examiner—Ronald D. Hartman, Jr.

(57) ABSTRACT

In order to improve the quality of a semiconductor product, mapping of the critical dimension of predetermined features such as ring oscillators, test transistors, turning forks WET transistors etc., is carried out at various stages of the process. For example, a reticle can be mapped, the etch mask which is produced from the effect of the image on the resist layer, and the results of the etching can be respectively mapped. The data gleaned from these mappings is used to determine from the end result if the reticle requires modification to change the resulting etch mask and modify the end product. Thus, when a new reticle is introduced to the process, it is possible to run the process and then work back via the collected critical dimension data to determined what changes in the reticle are appropriate in order to improve the end result.

7 Claims, 5 Drawing Sheets

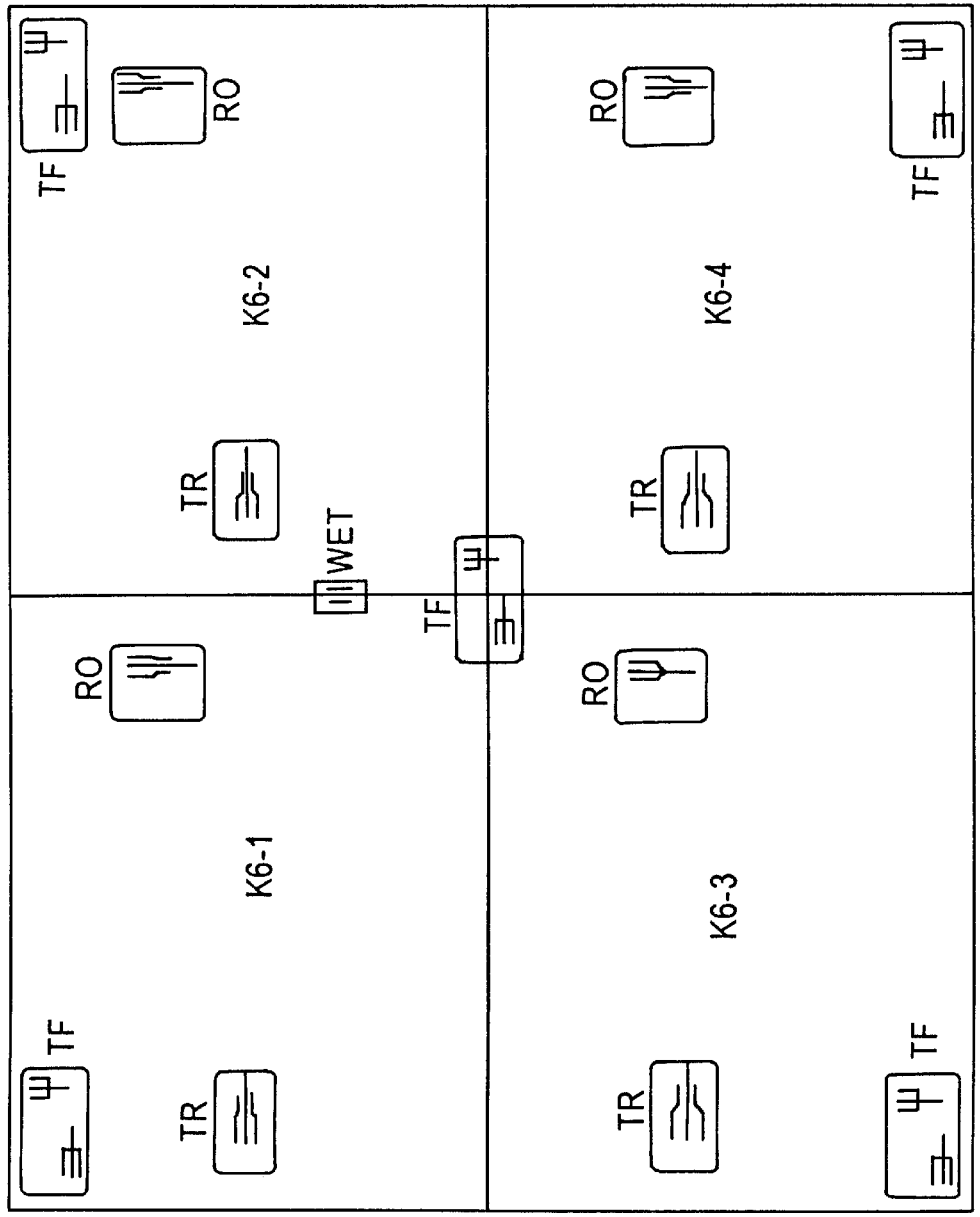
FIG. 2 POLY GATE CD MAP FEATURE LOCATION

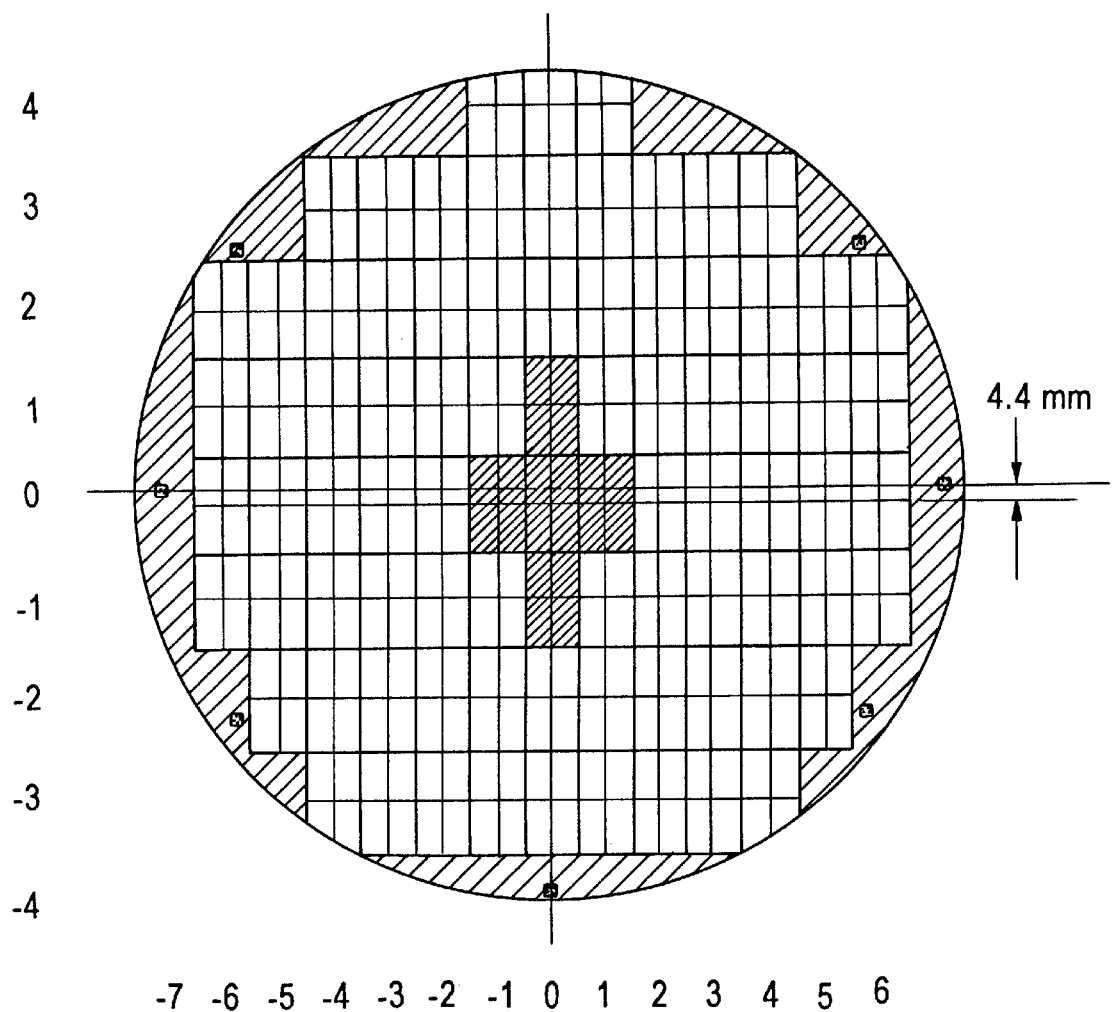

FIG. 4   CD MAP DATA SUMMARY

| TYPE | ORIEN | TARGET | STAT | K6_1 | K6_2 | K6_3 | K6_4 | MEAN | STD | RANGE |
|---|---|---|---|---|---|---|---|---|---|---|
| TR | HOR | DENSE | MEAN | 0.21274 | 0.21298 | 0.21496 | 0.21052 | 0.21280 | .0039807 | 0.0142 |
| TR | HOR | DENSE | STD | 0.00361 | 0.00514 | 0.00303 | 0.00378 | 0.21280 | .0039807 | 0.0142 |
| TR | HOR | DENSE | RANGE | 0.00810 | 0.01240 | 0.00810 | 0.00990 | 0.21280 | .0039807 | 0.0142 |
| TR | HOR | DENSO | MEAN | 0.21962 | 0.21680 | 0.21582 | 0.21038 | 0.21566 | .0053242 | 0.0166 |
| TR | HOR | DENSO | STD | 0.00549 | 0.00306 | 0.00563 | 0.00271 | 0.21566 | .0053242 | 0.0166 |
| TR | HOR | DENSO | RANGE | 0.01190 | 0.00720 | 0.01420 | 0.00590 | 0.21566 | .0053242 | 0.0166 |
| TR | HOR | ISO | MEAN | 0.21834 | 0.21326 | 0.21666 | 0.21508 | 0.21584 | .0044297 | 0.0170 |
| TR | HOR | ISO | STD | 0.00357 | 0.00532 | 0.00354 | 0.00467 | 0.21584 | .0044297 | 0.0170 |
| TR | HOR | ISO | RANGE | 0.00850 | 0.01380 | 0.00980 | 0.01180 | 0.21584 | .0044297 | 0.0170 |
| TR | VER | DENSO | MEAN | 0.21926 | 0.21058 | 0.21338 | 0.21244 | 0.21392 | .0051935 | 0.0164 |
| TR | VER | DENSO | STD | 0.00358 | 0.00277 | 0.00515 | 0.00533 | 0.21392 | .0051939 | 0.0164 |
| TR | VER | DENSO | RANGE | 0.00820 | 0.00710 | 0.01290 | 0.01400 | 0.21392 | .0051935 | 0.0164 |

| TYPE | ORIEN | TARGET | STAT | K6_1 | K6_2 | K6_3 | K6_4 | MEAN | STD | RANGE |
|---|---|---|---|---|---|---|---|---|---|---|
| RINGOS | HOR | DENSE | MEAN | 0.21318 | 0.21008 | 0.21106 | 0.21074 | 0.21127 | .0032030 | 0.0144 |
| RINGOS | HOR | DENSE | STD | 0.00233 | 0.00250 | 0.00541 | 0.00105 | 0.21127 | .0032030 | 0.0144 |
| RINGOS | HOR | DENSE | RANGE | 0.00530 | 0.00690 | 0.01440 | 0.00210 | 0.21127 | .0032030 | 0.0144 |
| RINGOS | HOR | DENSO | MEAN | 0.21158 | 0.20790 | 0.20924 | 0.20658 | 0.20883 | .0047685 | 0.0155 |
| RINGOS | HOR | DENSO | STD | 0.00518 | 0.00218 | 0.00526 | 0.00563 | 0.20883 | .0047685 | 0.0155 |
| RINGOS | HOR | DENSO | RANGE | 0.01330 | 0.00590 | 0.01180 | 0.01470 | 0.20883 | .0047685 | 0.0155 |
| RINGOS | HOR | ISO | MEAN | 0.21224 | 0.20728 | 0.20934 | 0.21076 | 0.20991 | .0048506 | 0.0145 |
| RINGOS | HOR | ISO | STD | 0.00365 | 0.00620 | 0.00541 | 0.00373 | 0.20991 | .0048506 | 0.0145 |
| RINGOS | HOR | ISO | RANGE | 0.00980 | 0.01450 | 0.01130 | 0.00980 | 0.20991 | .0048506 | 0.0145 |

| TYPE | ORIEN | TARGET | STAT | C | LL | LR | MEANS | UL | UR | STD | RANGE |
|---|---|---|---|---|---|---|---|---|---|---|---|
| WET | VER | DENSO | MEAN | 0.20245 | 0.20570 | 0.21142 | 0.21062 | 0.20808 | 0.20720 | .0042157 | 0.0106 |
| WET | VER | DENSO | STD | 0.00546 | 0.00374 | 0.00617 | | 0.00298 | 0.00485 | | |
| WET | VER | DENSO | RANGE | 0.01560 | 0.00980 | 0.01750 | | 0.00860 | 0.01150 | | |

| TYPE | ORIEN | TARGET | STAT | MEAN | STD | RANGE |
|---|---|---|---|---|---|---|
| TF | VER | DENSO | MEAN | 0.20697 | .0053506 | 0.0244 |
| TF | VER | DENSO | STD | 0.20697 | .0053506 | 0.0244 |
| TF | VER | DENSO | RANGE | 0.20607 | .0053506 | 0.0244 |

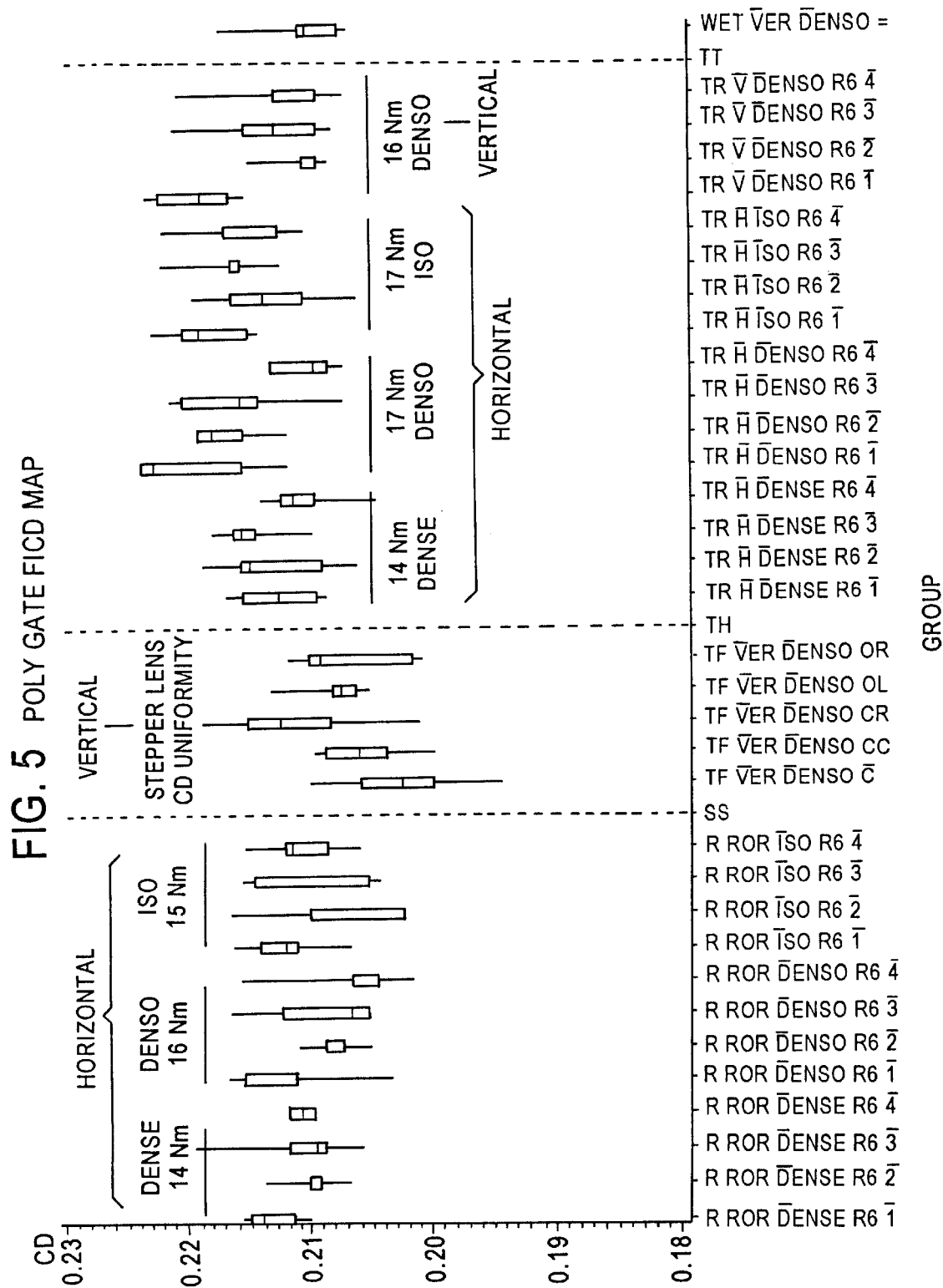
FIG. 5 POLY GATE FICD MAP

METHOD OF USING CRITICAL DIMENSION MAPPING TO QUALIFY A RETICLE USED IN INTEGRATED CIRCUIT FABRICATION

BACKGROUND OF THE INVENTION

1. Field of the Invention

The present invention relates generally to photolithography techniques which are used during the fabrication of semiconductor devices. More specifically, the present invention relates to a technique which uses multiple mappings of a critical dimension of selected features that are formed on wafer during formation of integrated circuits (IC), to enable optical proximity correction in an efficient manner and with particular regard to mitigating effects which are encountered during the various steps which are carried during the constructive processes.

2. Description of the Related Art

The minimum feature sizes of integrated circuits (ICs) have been constantly shrinking. Commensurate with this size reduction, various process limitations have made IC fabrication more difficult. One area of fabrication technology in which such limitations have appeared is photolithography which involves selectively exposing regions of a resist coated silicon wafer to a radiation pattern, and then developing the exposed resist in order to selectively protect regions of wafer layers (e.g., regions of substrate, polysilicon, dielectric or the like).

An integral component of a photolithographic apparatus is a "reticle" which contains a pattern corresponding to features at a layer in an IC design. These devices typically includes a transparent glass plate covered with a patterned light blocking material such as chromium. The reticle is placed between a radiation source producing radiation of a pre-selected wavelength and a focusing lens which forms part of a optics arrangement of a "stepper" apparatus. Located beneath the optics in which the reticle is disposed, is a table. The table is provided with a vacuum clutch or the like and is operatively connected with servo mechanisms to be movable in three mutually opposed directions with respect to optical arrangement in which the reticle is disposed. This allows a resist covered wafer which is supported on the table to be selectively moved with respect to the optics so that the resist coating can be repeatedly imprinted with an image produced by the reticle.

When the radiation from the radiation source is directed onto the reticle, light passes through the uncovered glass portions and projects onto the resist covered silicon wafer. In this manner, an image which is produced by the reticle is imprinted onto the resist.

The resist or photoresist as it is sometimes called, is provided as a thin layer of radiation-sensitive material that is spin-coated over the entire silicon wafer surface. The resist material is classified as either positive or negative depending on how it responds to light radiation. Positive resist, when exposed to radiation becomes more soluble and is thus more easily removed in a development process. As a result, a developed positive resist contains a resist pattern corresponding to the dark regions on the reticle. Negative resist, on the other hand, becomes less soluble when exposed to radiation. Consequently, a developed negative resist contains a pattern corresponding to the transparent regions of the reticle. For simplicity, the following discussion is in connection with positive resists, it being understood that negative resists may be substituted therefor given that the appropriate adjustments are made. For further information on IC fabrication and resist development methods, reference may be made to a book entitled Integrated Circuit Fabrication Technology by David J. Elliot, McGraw Hill, 1989.

One problem associated with photolithography is that light passing through a reticle tends to be refracted and scattered by the chromium edges. This causes the projected image to exhibit some rounding and other optical distortion. The problems become especially pronounced in IC designs having feature sizes near the wavelength of light used in the photolithographic process.

To overcome this problem, a reticle correction technique known as optical proximity correction ("OPC") has been developed. Optical proximity correction involves adding dark regions to and/or subtracting dark regions from a reticle design at locations chosen to resolve the distorting effects of diffraction and scattering. Typically, OPC is performed on a digital representation of a desired IC pattern. First, the digital pattern is evaluated using software to identify regions where optical distortion is apt to result. Optical proximity correction is then applied to compensate for the distortion. The resulting pattern is ultimately transferred to the reticle glass.

While such effects pose relatively little difficulty in layouts with large feature sizes (e.g., layouts with critical dimensions above about 1 micron), they can not be ignored in layouts having features less than about 1 micron.

The OPC process is generally performed by scanning a digital version of an IC layout design to identify feature dimensions, interfeature spacing, feature orientation, etc. The scanning process may proceed across the IC layout design in a rasterized fashion to cover the entire pattern. In some IC layout designs, it may also be necessary to conduct raster scans in the two or more directions (e.g., horizontal, vertical, and one or more diagonal directions). In some cases, the OPC computations may include generating a detailed computer model of a reticle image known as a Fast Aerial Image of Mask (FAIM). This image is then itself evaluated to determine where to make reticle corrections.

However, a drawback is encountered in that the process of performing OPC on modern IC layout designs having many features can be computationally intensive. In fact, OPC can sometimes be too great for even the most advanced computational resources. Obviously, when FAIM models are used, the computational difficulty increases significantly.

Further, one specific type of optical distortion requiring some form of correction is called "reflective notching." This form of distortion arises not from the interaction of light with the reticle pattern itself, but from the interaction of light with structures on the wafer surface. Specifically, light directed onto topographical variations introduced on a wafer surface at certain stages in the IC fabrication process (e.g., field oxide formation) scatters and reflects. As a result, illuminated line patterns crossing over a field oxide/active region interface or other topographically varying surface structure produces notches (reflective nothing).

This reflective notching, of course, tends to degrade integrated circuit performance. For example, the current carrying characteristics of a polysilicon line will deviate from design, in these narrow regions, potentially leading to hot spots in the polysilicon line. In some cases, such problems may render the resulting integrated circuit unusable. The speed and performance of a complex circuit, such as a microprocessor is, of course, adversely effected by such imperfections.

Accordingly, despite quite sophisticated advances in reticle inspection/correction, it is necessary to achieve further development in reticle adjustment and design in order to overcome the problems such as the above mentioned reflective notching.

SUMMARY OF THE INVENTION

The present invention is based on a technique wherein mapping is carried out at each of a select number of production stages, and wherein critical dimension (CD) data, which is accumulated during each of the mappings, is used to determine what adjustments can be made to reticle which is used in the production, to ensure that the closest possible adherence to the design requirements is achieved.

In other words, a feedback control data base is enabled. For example, mapping of results of the etching are examined and a line width or corner is too great or too small, or the configurations of given features are not as good as is required to assure the best performance of the device (e.g., features necessary to optimize the speed performance of a microprocessor for example) then determined what adjustments can be made to the process at each of the stages which are involved in the process, and to instigate changes which will enable improvements to be made and for a better product to be realized.

In particular, this technique, in accordance with the present invention, enables the design of an incoming reticle to be checked/modified so as to achieve the best possible results. Once the reticle is modified and its performance is assured, the amount of mapping which is used during actual production runs can be reduced to that which is necessary to determine that the process is running properly and that new reticle is functioning optimally.

More specifically, a first aspect of the present innovation resides in a method of improving IC fabrication comprising the steps of: mapping the critical dimensions of a predetermined plurality of features at each of a predetermined number of stages of production of an IC; comparing the data collected at each of the mappings; and determining, from the comparison, what changes are required in a selected one of the production stages to bring the critical dimension of the predetermined features into agreement with a predetermined set of design critical dimension. These predetermined features comprise ring oscillators, turning forks, test transistors, and WET transistors.

Another aspect of the present invention resides in a method of qualifying a reticle comprising the steps of: disposing a reticle in a stepper and exposing at least one exposure field using the reticle; mapping the critical dimension of all features the impact speed and performance of the IC, including ring oscillators, turning forks, test transistors, and WET transistors, which are located in the exposure field; comparing the mapped critical dimension with a set of corresponding prerequisite critical dimension values; and modifying the reticle in order to bring the critical dimension which are derived using the mapping into accordance with a difference between the mapped critical dimension and the prerequisite critical dimension values.

In this method the substrate comprises a wafer and wherein the coating of photo resist is formed to substantially cover an upper surface thereof; and the image is impressed a plurality of times in a predetermined sequence of preset positions to form a predetermined number of exposure fields on the coating by moving the wafer to a series of predetermined positions with respect to the reticle.

The critical dimension data in this aspect is limited to data pertaining to a predetermined number of critical elements comprising oscillators, turning forks, test transistors, and WET transistors and/or other elements which determine the speed of operation of the processors which are created by an etching step.

Another aspect of the invention resides in a method of qualifying a reticle comprising the steps of: mapping predetermined features of a reticle to determine a first set of critical dimension data; mounting the reticle in a stepper and operating the stepper to move the substrate into a predetermined position with respect to the reticle; impressing the image produced by the reticle onto a layer of photo resist formed on a substrate a plurality of times to form a corresponding plurality of exposure fields; removing the portion of the photo resist effected by the image impression to leave a photo resist mask pattern; mapping the predetermined features as they are formed in the photo resist mask pattern for each of selected exposure fields selected from among the plurality of exposure fields, to determine a second predetermined set of critical dimension data for the pattern; etching the substrate through the photo resist mask pattern; removing the photo resist mask pattern to reveal an etched pattern formed in the substrate; mapping the predetermined features in the etched pattern corresponding to each of the selected exposure fields and recording a third set of critical dimension data; comparing the first, and at least one of the second and third sets of critical dimension data with each other and/or a predetermined set of standard critical dimension data values; and determining an adjustment to the reticle which is required to reduce a difference between the third set of critical dimension data and the predetermined set of critical dimension data.

In accordance with this aspect the substrate comprises a wafer and wherein the step of impressing comprises impressing a predetermined plurality of images at a center portion of the wafer. The predetermined features comprise ring oscillators, turning forks, test transistors, and WET transistors.

BRIEF DESCRIPTION OF THE DRAWINGS

The various aspects and advantages of the present invention will become better understood as a description of the preferred embodiments is given with reference to the appended drawings in which:

FIG. 2 is an enlarged view of an exposure field showing the features which are mapped in accordance with the present invention;

FIG. 3 is a plan view of a wafer showing the positions of the exposure fields in which mapping according to the present invention is carried out;

FIG. 4 is a table showing the results which are graphed in FIG. 4; and

FIG. 5 is a graph showing an example of the results derived using the mapping technique.

DETAILED DESCRIPTION OF THE PREFERRED EMBODIMENTS

Figure 1:
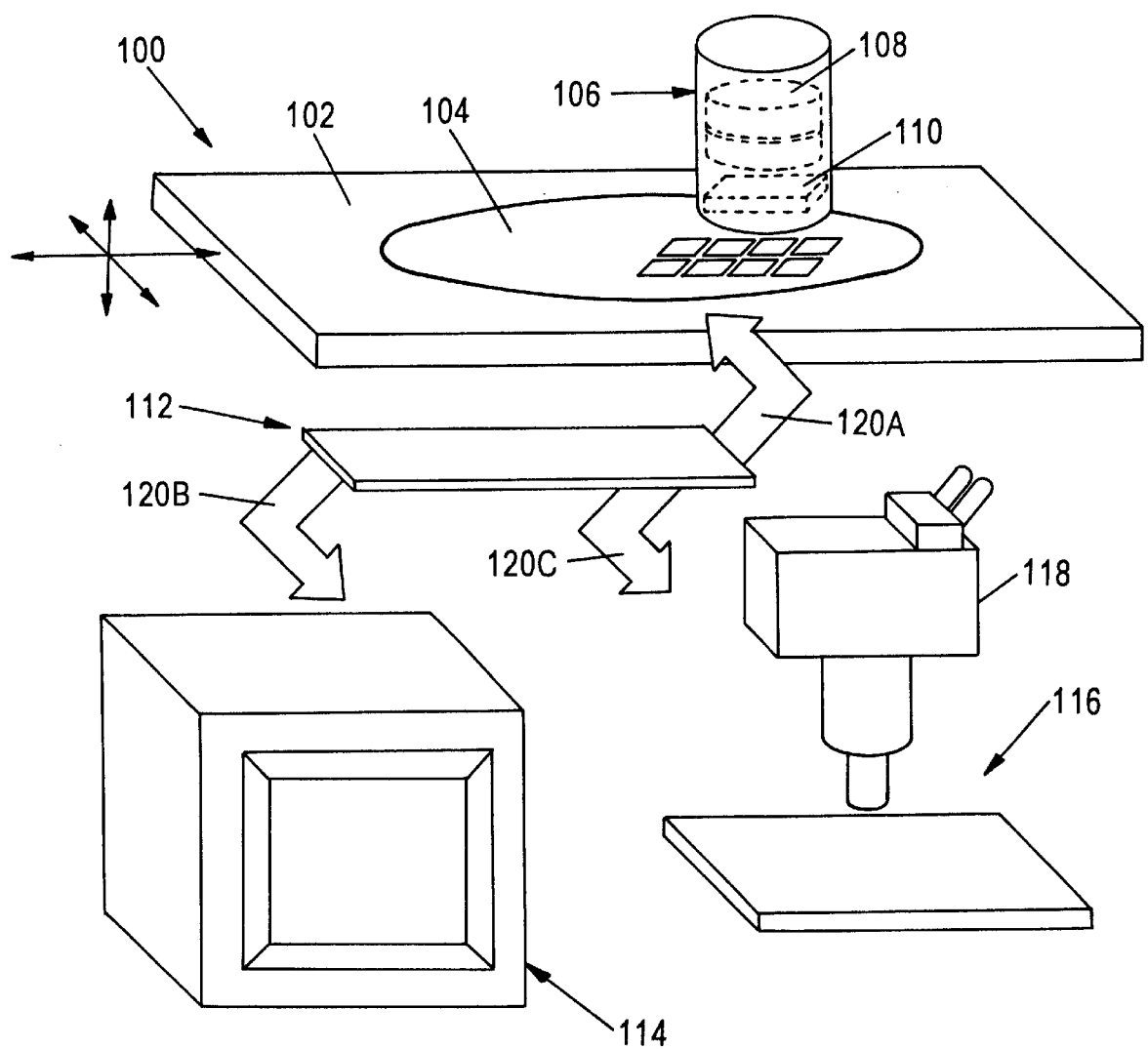
FIG. 1 is a schematic perspective view of a stepper which includes an optical system in which a reticle is mounted and a moveable table on which a wafer is carried.

FIG. 1 schematically shows a stepper 100 which includes a table 102 adapted to support and hold wafers 104 thereon, and an optical system 106 which includes a source of radiant energy 108 and a reticle 110 for determining the pattern which is imprinted on the wafer. A wafer track, which is use to move the wafers to and from the stepper, is denoted by the numeral 112. In this figure, the wafer track 112 is shown as being arranged to transport the wafer 104 between the stepper 100, a processing unit 114 in which etching (for example) can be carried out, and a mapping station 116 in which the features which are formed, can be measured via an electron microscope or the like device 118. Robotics which are associated with the wafer track and which are used to move the wafers from one device to another are designated by the numerals 120A, 120B and 120C.

As will be appreciated, this view is highly schematic and omits all but the outlines of the basic elements of the stepper 100, wafer track 112, processing unit or chamber 114, mapping station 116 and robotics 120A–120C. Further, only a limited number of chip outlines are shown on the wafer 104 and the overall arrangement is not drawn to scale nor is intended to accurately represent the actual structures of the respective devices. For further details pertaining to the construction, control and operation of steppers reference may be had to U.S. Pat. No. 5,392,361 issued on Feb. 21, 1995 in the name of Imaizumi et al. For details pertaining to wafer tracks and associated apparatus, reference may be had to U.S. Pat. No. 5,685,588 issued to Wong et al. on Nov. 11, 1997.

In accordance with the present invention, before the stepper is used to imprint the image which is produced by the reticle 110, repeatedly and sequentially over the surface of a resist covered wafer 104, a predetermined number of key features which are defined on the reticle are mapped and a first set of data is obtained.

FIG. 2 shows an example of the locations of the multiple features which are mapped in accordance with the present invention. As will be appreciated from this figure, a tuning fork feature TF is located at each of the four corners of the exposure field. A fifth tuning fork feature TF is formed at the center of the field at a location wherein the four quadrants K6-1, K6-2, K6-3 and K6-4 of the field, intersect with one another. Each of these features has a horizontal element and a vertical element.

Four ring oscillators RO and four test transistors TR are located in the illustrated locations. In this illustration, a single WET (Wafer Electrical Testing) transistor spans the boarder of the K6-1 and K6-2 quadrants of the exposure field. It will be understood from the following data that the test transistors, which are subjected to measurement in accordance with the present invention, have both vertical and horizontal elements which are subject to CD measurement.

Table I clarifies the element/function relationship which exists in accordance with an embodiment of the invention.

TABLE I

Poly Gate C.D. Map Features and Functions

| | Feature | | Function |
|---|---|---|---|
| (1) | Ring Oscillator Horizontal (R) | DENSE DENSO ISO | K6 1/2/3/4 K6 1/2/3/4 K6 1/2/3/4 | Directly Impacting Speed Performance and Sort Yield |
| (2) | Tuning Fork Vertical (TF) | DENSO, C (CENTER) DENSO, LL (LOWER LEFT) DENSO, LR (LOWER RIGHT) DENSO, UL (UPPER LEFT) DENSO, UR (UPPER RIGHT) | | No Electrical Value, For Measurement of Stepper Lens Field CD Control Uniformity Only |
| (3) | Test Transistor Horizontal (TR) Vertical | DENSE DENSO ISO DENSO | K6 1/2/3/4 K6 1/2/3/4 K6 1/2/3/4 K6 1/2/3/4 | Directly Impacting Speed Performance and Sort Yield |
| (4) | WET Transistor Vertical (WET) | DENSO | | For Process Electrical Evaluation Only (Electrical CDs) |

The mapping is carried out on the cluster of five center exposure fields which are shown in fine hatching at the center of the wafer 104 in FIG. 3. FIG. 4 shows an example of data is collected using a mapping which is carried out in accordance with the present invention while FIG. 5 shows this data in graphical form.

Embodiments of the present invention include optimizing by conducting more than one mapping to determine the best effect/modification which can be made to a reticle which is being qualified or calibrated in preparation for production. That is to say, the effect of an etching step, for example, which is carried out between the imprinting of the image on the resist layer and the final mapping which is carried out, can have a significant effect on the decision as to what modifications to the reticle are needed to rectify the process and to ensure that the CDs of the final product are as close to the design specifications as possible. For example, it is possible to exaggerate a portion of a given feature on the reticle if the CD data indicates that the etching process has an effect which negates the exaggeration and brings the portion in question to or close to the required specifications.

Accordingly, after the CD data for the features listed in the above table are measured via a mapping of the reticle, the reticle 110 is set in the stepper 100 and a photo resist covered wafer is imprinted. Following this, the wafer 104 is transferred to a reaction chamber, such as that depicted by numeral 114 in FIG. 1, wherein portions of the resist layer are removed to reveal the etch mask. The wafer 104 is then removed and the CDs of the same features which were mapped on the reticle are again mapped and the data recorded along with that for the reticle.

The wafer is then transported to a reaction chamber wherein etching is carried out. This etching can take the form of dry etching, wet etching, plasma etching or the like. The etching mask is then removed either by dissolution in a solvent or by oxidation. Inasmuch as each of these process are very well known in the art, a detailed explanation of this stage will be omitted for brevity.

The etched wafer is then removed from the chamber and each of the features which have been previously mapped are again mapped. This data is then stored.

The three sets of data are then compared to determine if the process is proceeding in a manner which is satisfactory and that the final product, i.e. the etched wafer is being produced with the features in such a condition that the speed performance and the like of the device, which is being constructed using the above mentioned steps, will be as good as desired. This comparison can reveal a great deal of information and provide guidance as to how to adjust one or more stages of the process to improve the end result. However, while the resist recipe, the etch recipe/parameters, the operation of the stepper and or wafer track, can have a profound influence on the IC which is produced, it is the reticle which is the center of attention in this instance.

It is deemed essentially self-evident to the person skilled in the art of producing IC circuits, how the multiple mapping of the invention can be used to show how the process proceeds and what feedback adjustments need to be made in order to achieved the desired end. Examples of the manner in which the above type of data can be interpreted and used, is given in U.S. Pat. No. 5,646,870, issued on Jul. 8, 1997, in the name of Krivokapic et al. This reference deals with process simulation and statistical analysis of CD values. The content of this reference is hereby incorporated by reference thereto.

More specifically, in the case wherein data is gathered via the mapping of poly gate CD for a specific reticle, if the collected data show the biases between iso/dense/denso features for the R (ring oscillator) and TR (test transistor) (see table 1 feature 1 and 3) are too high (i.e. >20 nm) due to optical proximity effect, the reticle is disqualified for the product until a new reticle with OPC (Optical Proximity Correction is made.

Only the preferred embodiments of the present invention and but a few examples of its versatility are shown and described in the present disclosure. However, it is to be understood that the present invention is capable of use in various other combinations and environments and is capable of changes or modifications with the scope of the inventive concept expressed herein.

What is claimed is:

1. A method of qualifying a reticle used to make an IC device comprising the steps of:

mapping all features of the reticle that impact speed and performance of the IC device to obtain a first set of critical dimension data;

disposing a reticle in a stepper and exposing at least one exposure field of the IC device using the reticle;

performing a first processing of said IC device to form all said features on said IC device and then mapping the critical dimension of all said features to obtain a second set of critical dimension data;

performing a second processing of said IC and then mapping the critical dimension of all said features formed on said IC device to obtain a third set of critical dimension data;

comparing the first, second and third sets of critical dimension data with a set of corresponding prerequisite critical dimension values; and modifying the reticle in accordance with a result of the step of comparing to bring the critical dimension data of all said features formed on said IC device into accordance with the prerequisite critical dimension values.

2. The method as set forth in claim 1, wherein:

said IC device is formed on a wafer;

a coating of photo resist is formed to substantially cover an upper surface of the wafer; and the step of exposing includes causing an image to be impressed a plurality of times in a predetermined sequence of preset positions to form a predetermined number of exposure fields on the coating by moving the wafer to a series of predetermined positions with respect to the reticle.

3. The method as set forth in claim 1, wherein all said features of the reticle that impact speed and performance of the IC device include oscillators, turning forks, test transistors, and wafer electrical testing-purpose (WET) transistors and/or other elements.

4. A method of qualifying a reticle for use in manufacturing a semiconductor device, the method comprising the steps of:

mapping predetermined features of a reticle to determine a first set of critical dimension data;

mounting the reticle in a stepper and operating the stepper to move the substrate into a predetermined position with respect to the reticle;

impressing the image produced by the reticle onto a layer of photo resist formed on a substrate a plurality of times to form a corresponding plurality of exposure fields;

removing the portion of the photo resist effected by the image impression to leave a photo resist mask pattern;

mapping the predetermined features as they are formed in the photo resist mask pattern for each of selected exposure fields selected from among the plurality of exposure fields, to determine a second set of critical dimension data for the pattern;

etching the substrate through the photo resist mask pattern;

removing the photo resist mask pattern to reveal an etched pattern formed in the substrate;

mapping the predetermined features in the etched pattern corresponding to each of the selected exposure fields and recording a third set of critical dimension data;

comparing the first, and at least one of the second and third sets of critical dimension data with each other and/or a predetermined set of standard critical dimension data values; and determining an adjustment to the reticle which is required to reduce a difference between the third set of critical dimension data and the predetermined set of critical dimension data.

5. The method as set forth in claim 4, wherein the substrate comprises a wafer and wherein the step of impressing comprises impressing a predetermined plurality of images at a center portion of the wafer.

6. The method as set forth in claim 5, wherein the predetermined features comprise ring oscillators, turning forks, test transistors, and wafer electrical testing-purpose (WET) transistors.

7. A method of qualifying a reticle used to make an IC device comprising the steps of:

mapping critical dimensions of a plurality of features of the reticle including ring oscillators, turning forks, test transistors, and wafer electrical testing-purpose (WET) transistors, to obtain a first set of critical dimension data;

disposing a reticle in a stepper and exposing at least one exposure field of the IC device using the reticle;

subjecting the IC device to a first production stage and then mapping the critical dimension of all said features to obtain a second set of critical dimension data;

subjecting the IC device to a second production stage and then mapping the critical dimension data of all said features formed on said IC device to obtain a third set of critical dimension data;

comparing the first, second and third sets of critical dimension data with a set of corresponding prerequisite critical dimension values; and modifying the reticle in accordance with a result of the step of comparing the first, second and third sets of critical dimension data with the set of corresponding prerequisite critical dimension values.

* * * * *